US 12,426,204 B2

(12) United States Patent
Tsai et al.

(10) Patent No.: US 12,426,204 B2
(45) Date of Patent: Sep. 23, 2025

(54) LIQUID COOLING PUMPING UNIT

(71) Applicant: Cooler Master Co., Ltd., Taipei (TW)

(72) Inventors: Shui-Fa Tsai, Taipei (TW); Yu-Jyun Chen, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 138 days.

(21) Appl. No.: 18/350,780

(22) Filed: Jul. 12, 2023

(65) Prior Publication Data

US 2024/0074105 A1  Feb. 29, 2024

(30) Foreign Application Priority Data

Aug. 31, 2022 (TW) ................................ 111209424

(51) Int. Cl.
| | |
|---|---|
| H05K 7/20 | (2006.01) |
| F04D 13/06 | (2006.01) |
| F04D 29/42 | (2006.01) |
| G06F 1/20 | (2006.01) |

(52) U.S. Cl.
CPC ......... H05K 7/20272 (2013.01); F04D 13/06 (2013.01); F04D 13/0606 (2013.01); F04D 13/0626 (2013.01); F04D 29/4293 (2013.01); G06F 1/20 (2013.01)

(58) Field of Classification Search
CPC ....... H05K 2/20272; G06F 1/20; F04D 13/06; F04D 13/0606; F04D 13/0626; F04D 29/4293
See application file for complete search history.

(56) References Cited

U.S. PATENT DOCUMENTS

| 9,441,640 B2 * | 9/2016 | Park ....................... F04D 29/586 |
| 11,821,439 B2 * | 11/2023 | Tsai .......................... G06F 1/20 |
| 12,171,083 B2 * | 12/2024 | Tsai .................... F04D 13/0673 |
| 2004/0052663 A1 * | 3/2004 | Laing ....................... G06F 1/20 |
| | | 257/E23.098 |

FOREIGN PATENT DOCUMENTS

GB  743739 A  *  1/1956

* cited by examiner

*Primary Examiner* — Charles G Freay
(74) *Attorney, Agent, or Firm* — MERCHANT & GOULD P.C.

(57) ABSTRACT

A liquid cooling pumping unit including a cover, rotor, housing, driver, flow spray plate, and thermal plate is provided. The cover is above the housing, the housing above the base, and the base above the thermal plate. A first fluid chamber is defined by a chamber of the cover and an annular chamber of the housing. An inlet of the housing is in fluid connection with the first fluid chamber. A second fluid chamber is defined by the flow spray plate and a recess of the thermal base. An outlet of the base is in fluid connection with the second fluid chamber. An impeller of the rotor is rotatable in the first fluid chamber. The driver is above the base and under the housing, driving the rotor to rotate with respect to the housing. The first fluid chamber is in fluid communication with the second fluid chamber.

18 Claims, 9 Drawing Sheets

LIQUID COOLING PUMPING UNIT

RELATED APPLICATIONS

This US application claims the benefit of priority to Taiwan application no. 111209424, filed on Aug. 31, 2022, of which is incorporated herein by reference in its entirety.

TECHNICAL FIELD

The present disclosure is related to the field of heat transfer in general and more particularly but not limited to liquid cooling pumping units.

BACKGROUND OF THE INVENTION

During operation of electric and electronic devices and systems, the heat generated by heat producing components, for example, CPUs, processing units, or graphic boards, must be dissipated quickly and efficiently to keep operating temperatures within manufacturer recommended ranges, under, at times, challenging operating conditions. As the components increase in functionality and applicability, so does the cooling requirements of said components.

Several techniques have been developed for extracting heat from heat producing components. One such technique is liquid cooling. Liquid cooling uses a cooling liquid as a cooling medium for heat extraction. Liquid cooling systems can be comprised of a plurality of devices interconnected by fluid tubing to achieve a fluid loop. The fluid loop provides continuous movement of cooling liquid to cool and removes heat from the components.

Often, a liquid cooling unit of the liquid cooling system is mounted and dedicated to one or more heat producing components to cool and remove heat from said components. The liquid cooling unit must be securely mounted to the components without excessive deflection or damage to said components due to size or weight. However, the liquid cooling units can exceed a size and weight limitation of particular heat producing components or dedicated footprint in particular heated environments.

In order to fit a liquid cooling unit to different heat producing components' heat extraction areas, interchangeable and modalized parts of a liquid cooling unit can be made available. However, the greater the number of parts and seals required to complete assembly of modalized liquid cooling units, the greater the opportunity for said parts and seals to be damaged, incorrectly selected, or improperly used or installed, resulting in leakage or improper operation which can damage the environment the liquid cooling system is intended to cool.

SUMMARY OF THE INVENTION

The present disclosure provides a liquid cooling pumping unit including a cover, a housing having an inlet, a base having an outlet, and a thermal plate, wherein the cover is configured above the housing, the housing above the base and the base above the thermal plate so as to decrease a height, number of assembly parts, and number of watertight seal portions of the liquid cooling pumping unit, decreasing footprint, decreasing assembly steps, and decreasing potential leakage areas.

In at least one embodiment, the liquid cooling pumping unit includes a base, a housing, a rotor, a thermal plate, a flow spray plate, and a driver. The cover is configured above the housing, the housing above the base, and the base above the thermal plate. A first fluid chamber is defined by a chamber of the cover and an annular chamber of the housing. The rotor includes an impeller and a magnetic component. The impeller is rotatable in the first fluid chamber and the magnetic component is configured to rotate the impeller. An inlet of the housing is in fluid connection with the first fluid chamber. The driver includes a stator and the driver is above the base and below the housing. The stator is positioned in a stator chamber of the housing. The stator corresponds to the magnetic component so as to drive the rotor to rotate with respect to the housing. The flow spray plate includes a through slot and a cut-out. A second fluid chamber is defined by the flow spray plate covering a recess of the thermal base. The first fluid chamber is in fluid communication with the second fluid chamber via at least the through slot of the flow spray plate. The second fluid chamber is in fluid connection with an outlet of the base via the cut-out of the flow spray plate and an outlet ramp of the recess. The cover further includes an annular outer side.

In at least one embodiment, the cover further includes a conduit. The conduit is disposed longitudinal within the cover. The conduit is in fluid connection with the inlet and in fluid connection with the first fluid chamber. In at least one embodiment, the cover further includes a cover outlet. The cover outlet is disposed centrally transverse within the cover. The conduit is in fluid connection with the first fluid chamber via the cover outlet. In at least one embodiment, the cover further includes a cover inlet. The cover inlet is disposed transverse within the cover and closer to the outer side than the cover outlet. The inlet is in fluid connection with the conduit via the cover inlet. In at least one embodiment, the housing further includes an inlet connector portion. The inlet connector portion is disposed transverse within the housing. The inlet is in fluid connection with the cover inlet via the inlet connector portion.

In at least one embodiment, the housing further includes an annular housing ring. The annular housing ring is disposed surrounding the stator chamber and annular chamber. The inlet is disposed on the annular housing ring. In at least one embodiment, the housing further includes a first chamber outlet. The first chamber outlet is disposed transverse within the housing. The first fluid chamber is in fluid connection with the second fluid chamber via at least the first chamber outlet. In at least one embodiment, a center of the first chamber outlet and a center of the housing define a major axis. The inlet is disposed on an opposite side of the first chamber outlet and offset of the major axis. In at least one embodiment, the base further includes a base through hole. The first chamber is in fluid communication with the second fluid chamber via the first chamber outlet, the base through hole and the through slot.

In at least one embodiment, the base further includes a plurality of fastener posts. The plurality of fastener posts is disposed on the base and configured to fasten the cover and the housing to the base.

In at least one embodiment, the impeller includes an extended impeller body and a plurality of curved blades. The extended impeller body corresponds in dimensions to the annular chamber and surpasses in depth to the annular chamber. The plurality of curved blades corresponds in dimensions to the chamber, and at least a portion of the extended impeller body and the plurality of curved blades correspond in depth to the chamber.

In at least one embodiment, the thermal plate further includes a fin structure including a plurality of fins. The fin structure is disposed within the recess of the thermal plate and every two of the plurality of fins that are adjacent to each other are spaced by a passageway.

In at least one embodiment, the outlet is assembled on a same plane as the inlet.

In at least one embodiment, the liquid cooling pumping unit further includes a first seal ring. The first seal ring is assembled between and clamped by the cover and the housing.

In at least one embodiment, the liquid cooling pumping unit further including a second seal ring. The second seal ring is assembled between and clamped by the first chamber outlet of the housing and the base through hole of the base.

In at least one embodiment, the liquid cooling pumping unit further includes a third seal ring. The third seal ring assembled between and clamped by the base and the thermal plate.

In at least one embodiment, the liquid cooling pumping unit further includes a pair of brackets. The pair of brackets is assembled on opposing sides of the base.

In at least one embodiment, the liquid cooling pumping unit further includes a pair of connectors. One of the pair of connectors is assembled on the inlet and an other of the pair of connectors is assembled on the outlet.

BRIEF DESCRIPTION OF DRAWINGS

Unless specified otherwise, the accompanying drawings illustrate aspects of the innovative subject matter described herein. Referring to the drawings, wherein like reference numerals indicate similar parts throughout the several views, several examples of liquid cooling pumping units incorporating aspects of the presently disclosed principles are illustrated by way of example, and not by way of limitation.

DETAILED DESCRIPTION

Figure 1:
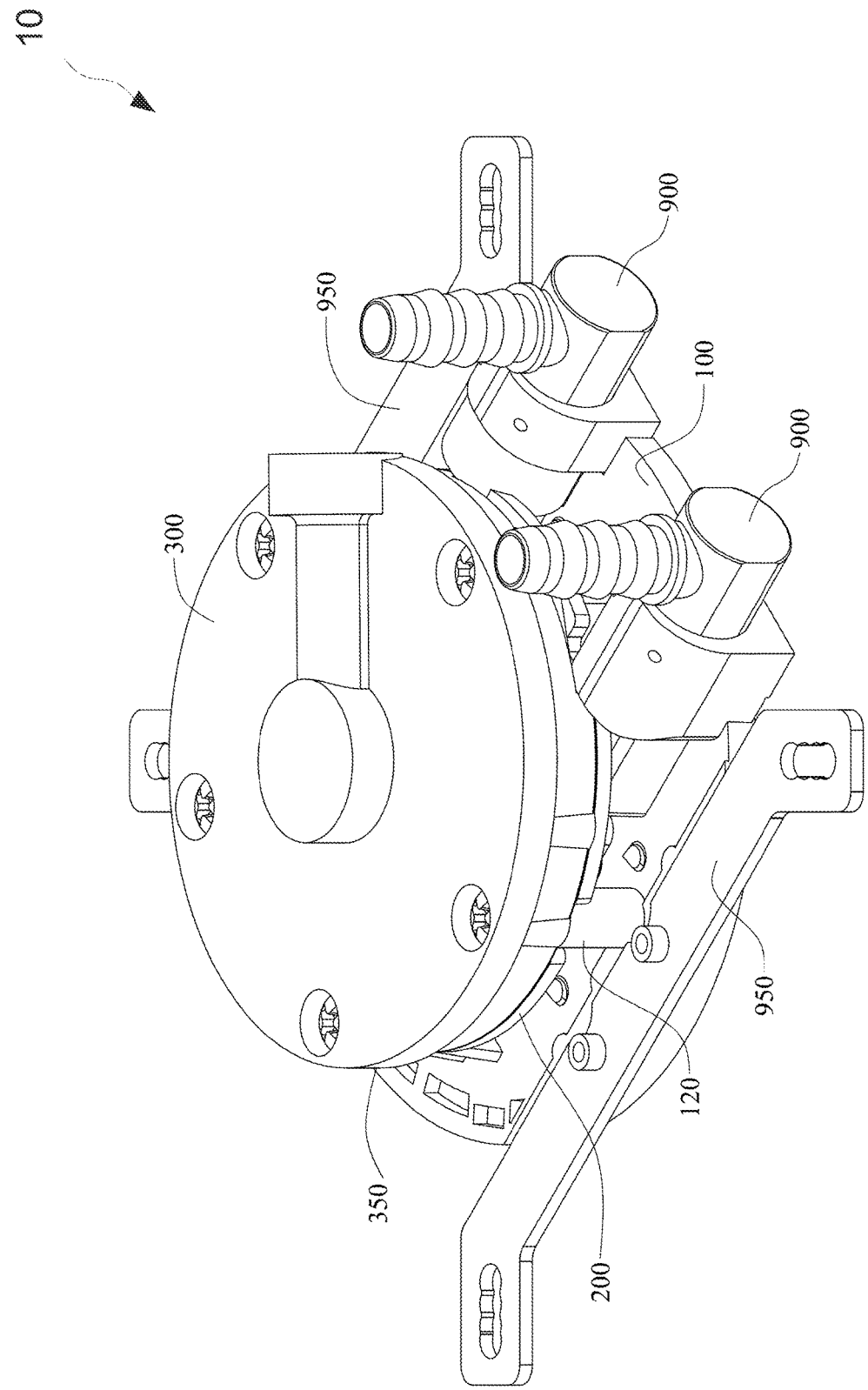
FIG. 1 is a perspective view of a liquid cooling pumping unit according to one embodiment of the present disclosure.
Figure 2:
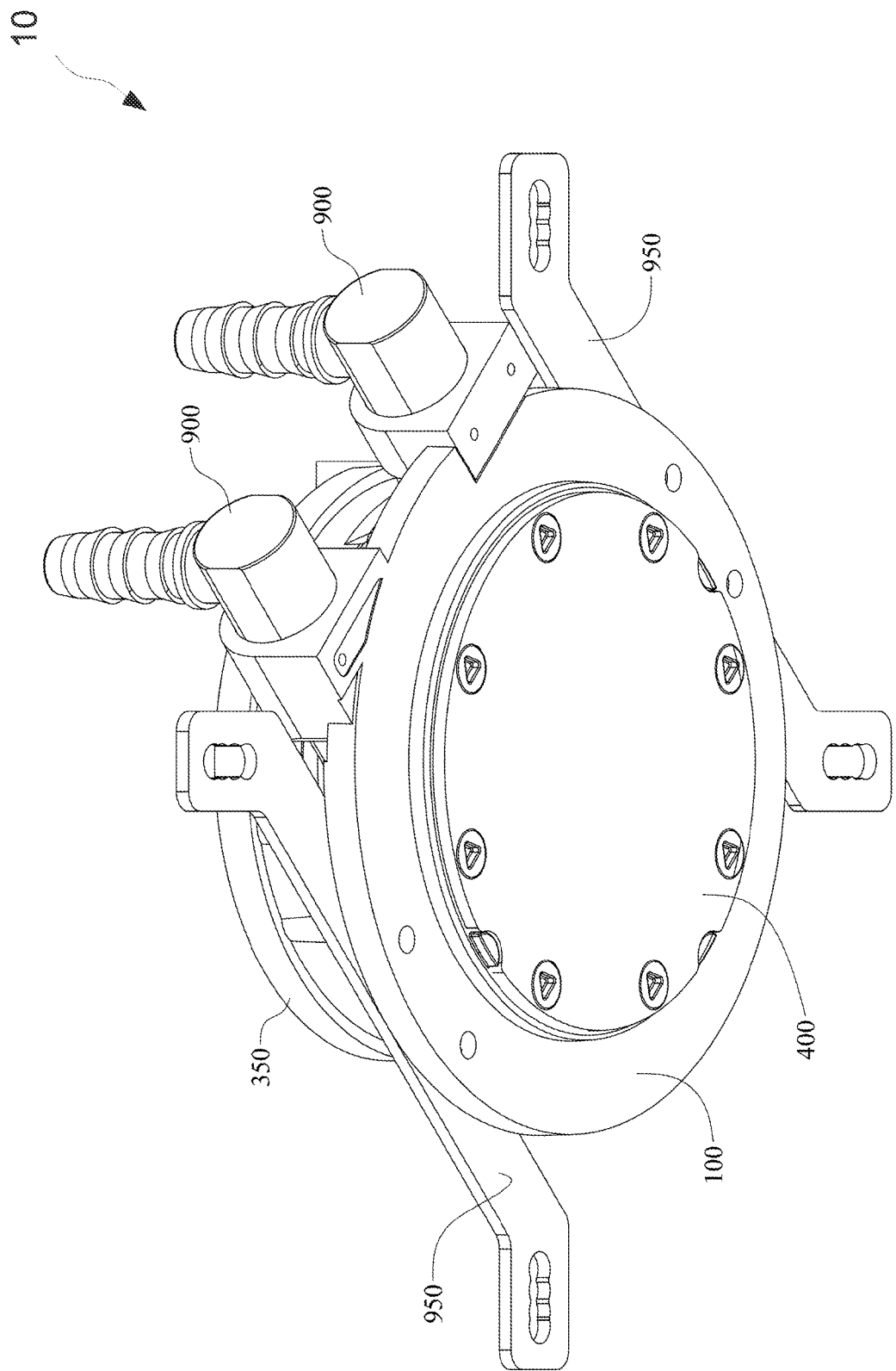
FIG. 2 is a bottom angled view of the liquid cooling pumping unit in FIG. 1.
Figure 3:
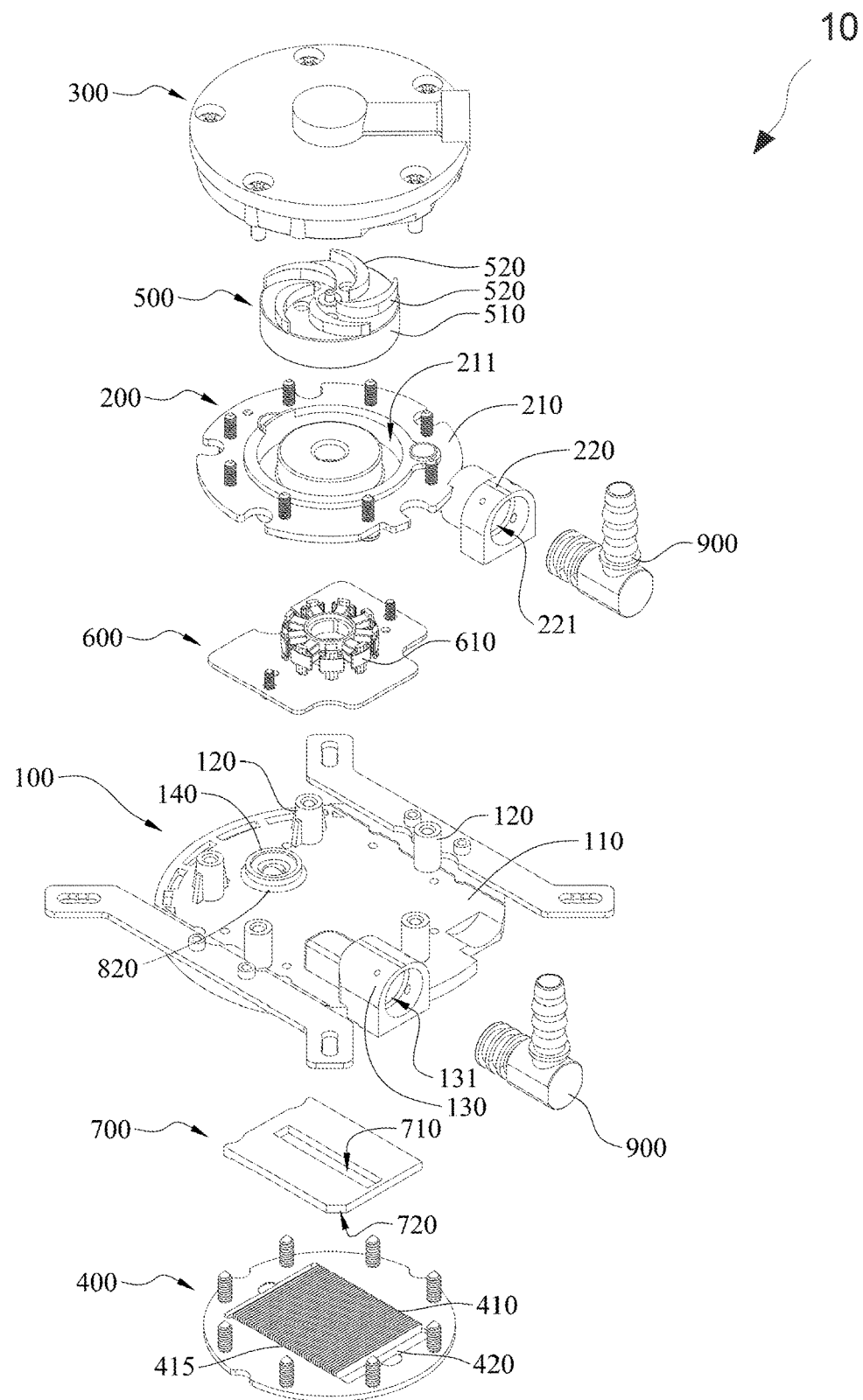
FIG. 3 is an exploded view of the liquid cooling pumping unit in FIG. 1.
Figure 4:
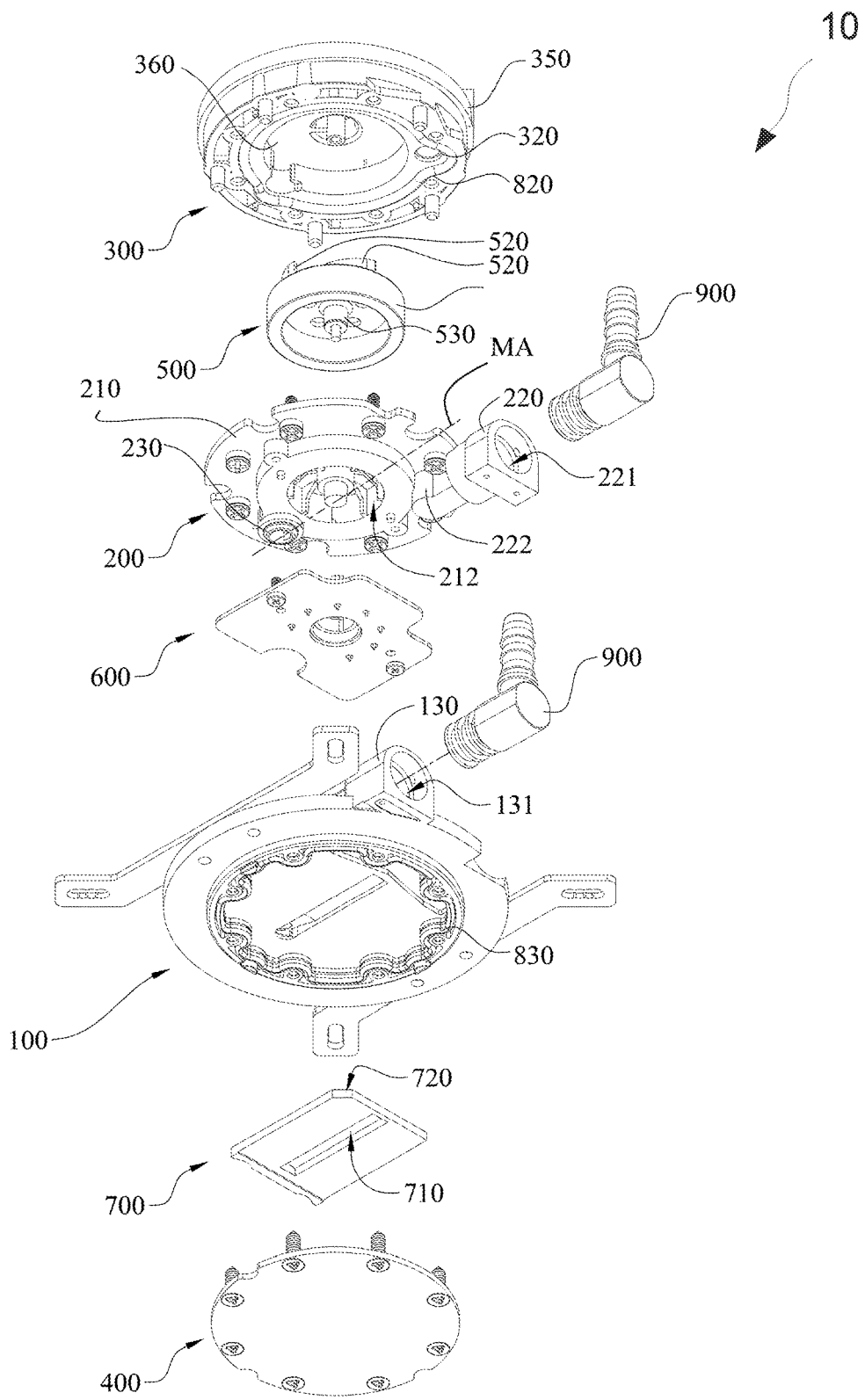
FIG. 4 is a bottom angled view of the liquid cooling pumping unit in FIG. 3.

The following describes various principles related to liquid cooling systems by way of reference to specific examples of liquid cooling pumping units, including specific arrangements and examples of water block units, and pump units embodying innovative concepts. More particularly, but not exclusively, such innovative principles are described in relation to selected examples of covers, housings, and bases and well-known functions or constructions are not described in detail for purposes of succinctness and clarity. Nonetheless, one or more of the disclosed principles can be incorporated in various other embodiments of covers, housings, and bases to achieve any of a variety of desired outcomes, characteristics, and/or performance criteria.

Thus, liquid cooling pumping units having attributes that are different from those specific examples discussed herein can embody one or more of the innovative principles, and can be used in applications not described herein in detail. Accordingly, embodiments of liquid cooling pumping units not described herein in detail also fall within the scope of this disclosure, as will be appreciated by those of ordinary skill in the relevant art following a review of this disclosure.

Example embodiments as disclosed herein are directed to liquid cooling systems, wherein a water block unit is in thermal contact with electric and/or electronic components, devices and/or systems, transporting heat away therefrom, and then cooling fluid, circulating inside of a cooling loop system incorporating the water block unit, flows over the water block unit by a pumping unit, removing heat therefrom. The heated cooling fluid is output from the water block unit and may be input to a radiator. The heated cooling fluid may flow to and through the radiator, whereby, the radiator may have a plurality of heat fins thereon for increased heat dissipation. Then the cooling fluid may flow from the radiator to the pumping unit and water block to once again begin the cooling loop.

The liquid cooling system may be configured within a chassis or as part of an electric or electronics system that includes heat producing components to be cooled. The liquid cooling system includes at least one liquid-based cooling loop, and may further comprise one or more fans. The one or more fans may be coupled to the back end of a radiator via a fastener (e.g., bolts, screws, an adhesive material, etc.) at structural portions of the radiator, transporting air through the radiator to an air plenum or to an outside of the chassis or electric or electronics system.

FIGS. 1-4 include at least one embodiment of a liquid cooling pumping unit 10. The liquid cooling pumping unit 10 includes a base 100, a housing 200, a rotor 500/530, a thermal plate 400, a flow spray plate 700, and a driver 600. The cover 300 is configured above the housing 200, the housing 200 above the base 100, and the base 100 above the thermal plate 400. The cover 300, the housing 200, the base 100, and the thermal plate 400, together, can be stack assembled and interconnected, via, as an example, screws, such that that a cooling loop passing cooling fluid is contained internal of the liquid cooling pumping unit 10, and capable of flowing among said loop for cooling of electrical or electronic heated components. The cover 300, the housing 200, the base 100, and the thermal plate 400 can be an elliptical shape. A first fluid chamber S1 is defined by a chamber 360 of the cover 300 and an annular chamber 211 of the housing 200. The chamber 360 of the cover 300 can be a cylindrical indentation shape and the annular chamber 211 can be an annulus indentation shape. The rotor 500/530 includes an impeller 500 and a magnetic component 530. The impeller 500 is rotatable in the first fluid chamber S1 and the magnetic component 530 is configured to rotate the impeller 500. An inlet 220 of the housing 200 is in fluid connection with the first fluid chamber S1. The driver 600 includes a stator 610 and the driver 600 is above the base 100 and below the housing 200. The stator 610 is positioned in a stator chamber 212 of the housing 200. The stator chamber 212 can be an annulus indentation shape disposed on an opposite side to the annular chamber 211. The stator 610 corresponds to the magnetic component 530 so as to drive the rotor 500/530 to rotate with respect to the housing 200. The flow spray plate 700 includes a through slot 710 and a cut-out 720. The flow spray plate 700 can be a quadrilateral shape, the through slot 710 can be centrally disposed through the flow spray plate 700 and can be a rectangular shape, and the cut-out 720 can be a corner cut-out of the flow spray plate 700. A second fluid chamber S2 is defined by the flow spray plate 700 covering a recess 415 of the thermal base 100. The recess 415 can be a quadrilateral indentation shape and dimensions of the recess 415 can be larger than the flow spray plate 700. The first fluid chamber S1 is in fluid communication with the second fluid chamber S2 via at least the through slot 710 of the flow spray plate 700. The second fluid chamber S2 is in fluid connection with an outlet 130 of the base 100 via the cut-out 720 of the flow spray plate 700 and an outlet ramp 420 of the recess 415. The cover 300 further includes an annular outer side 350.

In at least one embodiment, the impeller 500 includes an extended impeller body 510 and a plurality of curved blades 520. The extended impeller body 510 corresponds in dimensions to the annular chamber 211, can be a cylindrical shape, and surpasses in depth to the annular chamber 211. The plurality of curved blades 520 corresponds in dimensions to the chamber 360, and at least a portion of the extended impeller body 510 and the plurality of curved blades 520 correspond in depth to the chamber 360.

In at least one embodiment, the housing 200 further includes an annular housing ring 210. The annular housing ring 210 is disposed surrounding the stator chamber 212 and annular chamber 211 and can be ring shaped. The inlet 220 is disposed on the annular housing ring 210. In at least one embodiment, the housing 200 further includes a first chamber outlet 230. The first chamber outlet 230 is disposed transverse within the housing 200 and can be parallel to the chamber 360. The first fluid chamber S1 is in fluid connection with the second fluid chamber S2 via at least the first chamber outlet 230 and the through slot 710. In at least one embodiment, a center of the first chamber outlet 230 and a center of the housing 200 define a major axis MA. The inlet 220 is disposed on an opposite side of the first chamber outlet 230 and offset of the major axis MA. In at least one embodiment, the base 100 further includes a base through hole 140. The first fluid chamber is in fluid communication with the second fluid chamber S2 via the first chamber outlet 230, the base through hole 140 and the through slot 710.

In at least one embodiment, the inlet 220 defines an inlet passageway 221 and the inlet passageway 221 can be a cylindrical shape. In at least one embodiment, the housing 200 further includes an inlet connector portion 222. The inlet connector portion 222 is disposed transverse within the housing 200, can be parallel to the annular chamber 211, and can be a cylindrical shape. The inlet passageway 221 is in fluid connection with the cover inlet 320 via the inlet connector portion 222.

In at least one embodiment, the liquid cooling pumping unit 10 further includes a first seal ring 820. The first seal ring 820 is assembled between and clamped by the cover 300 and the housing 200. In at least one embodiment, the liquid cooling pumping unit 10 further including a second seal ring 820. The second seal ring 820 is assembled between and clamped by the first chamber outlet 230 of the housing 200 and the base through hole 140 of the base 100. In at least one embodiment, the liquid cooling pumping unit 10 further includes a third seal ring 830. The third seal ring 830 assembled between and clamped by the base 100 and the thermal plate 400.

Figure 5:
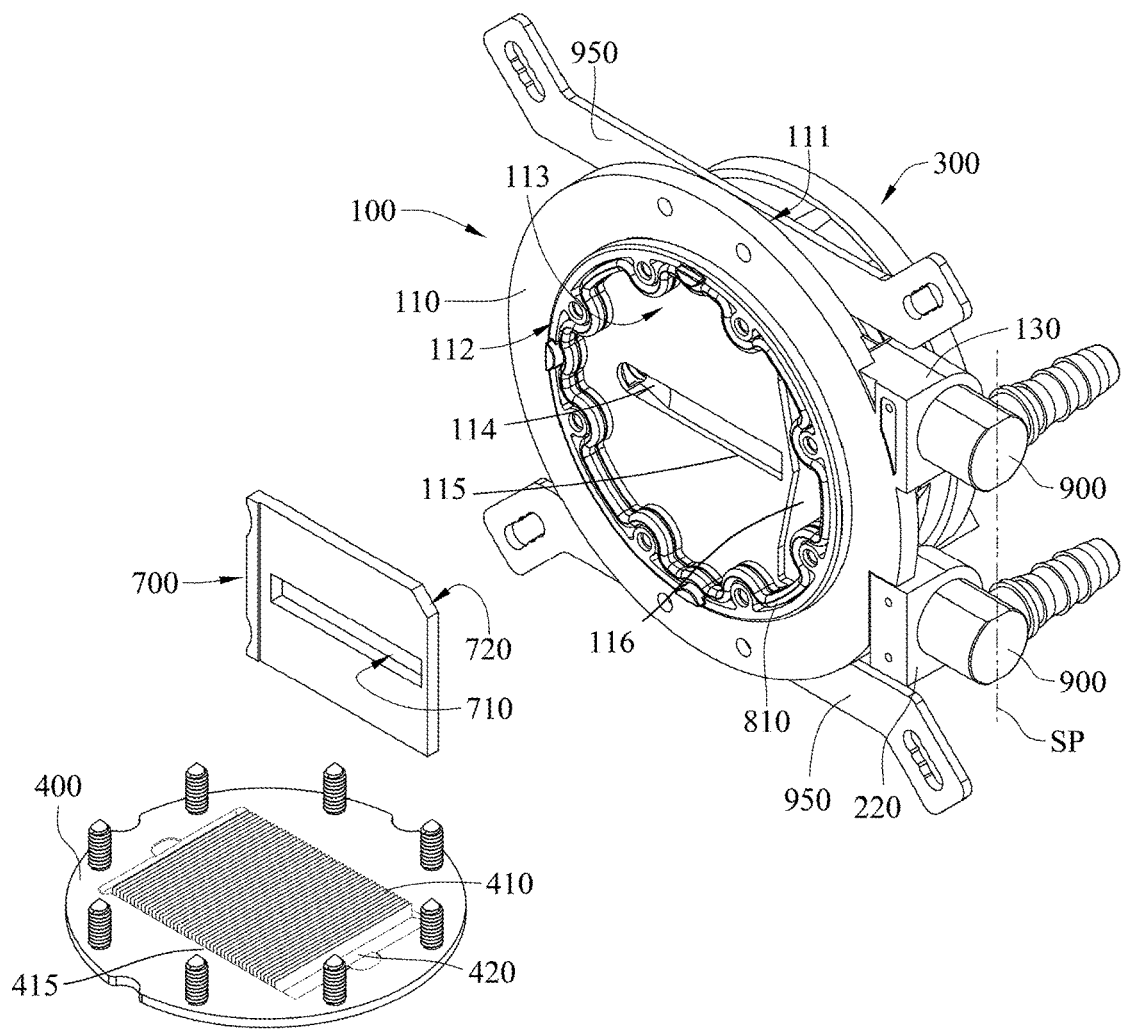
FIG. 5 is a partially exploded view of the liquid cooling pumping unit in FIG. 1.

FIG. 5 includes a partially exploded view of the liquid cooling pumping unit 10. In at least one embodiment, the outlet 130 is assembled on a same plane SP as the inlet 220. In at least one embodiment, the thermal plate 400 further includes a fin structure including plurality of fins 410. The fin structure is disposed within the recess 415 of the thermal plate 400 and every two of the plurality of fins 410 that are adjacent to each other are spaced by a passageway. In at least one embodiment, the plurality of fins 410 can be perpendicular to the through slot 710 of the flow spray plate 700 so that the cooling fluid can be sprayed throughout the second fluid chamber S2 drawing heat from electrical or electronic components (heat producing components) of a system that a liquid cooling system cools. In at least one embodiment, the bottom surface 112 of the body 110 of the base 100 includes a cavity 113. The flow spray plate 700 and the third seal ring 830 can be assembled in the cavity 113. In at least one embodiment, the cavity 113 includes a through slot indentation 115 and an outlet indentation 116. The through slot indentation 115 includes a flow ramp 114 extending from the base through hole 140, can be a quadrilateral shape, can be centrally disposed on the bottom surface 112, and can be corresponding to the through slot 710 of the flow spray plate 700. The outlet indentation 116 can be centrally disposed on one end of the through slot indentation 115, and can be at least partially corresponding to the outlet ramp 420 of the recess 415.

Figure 6:
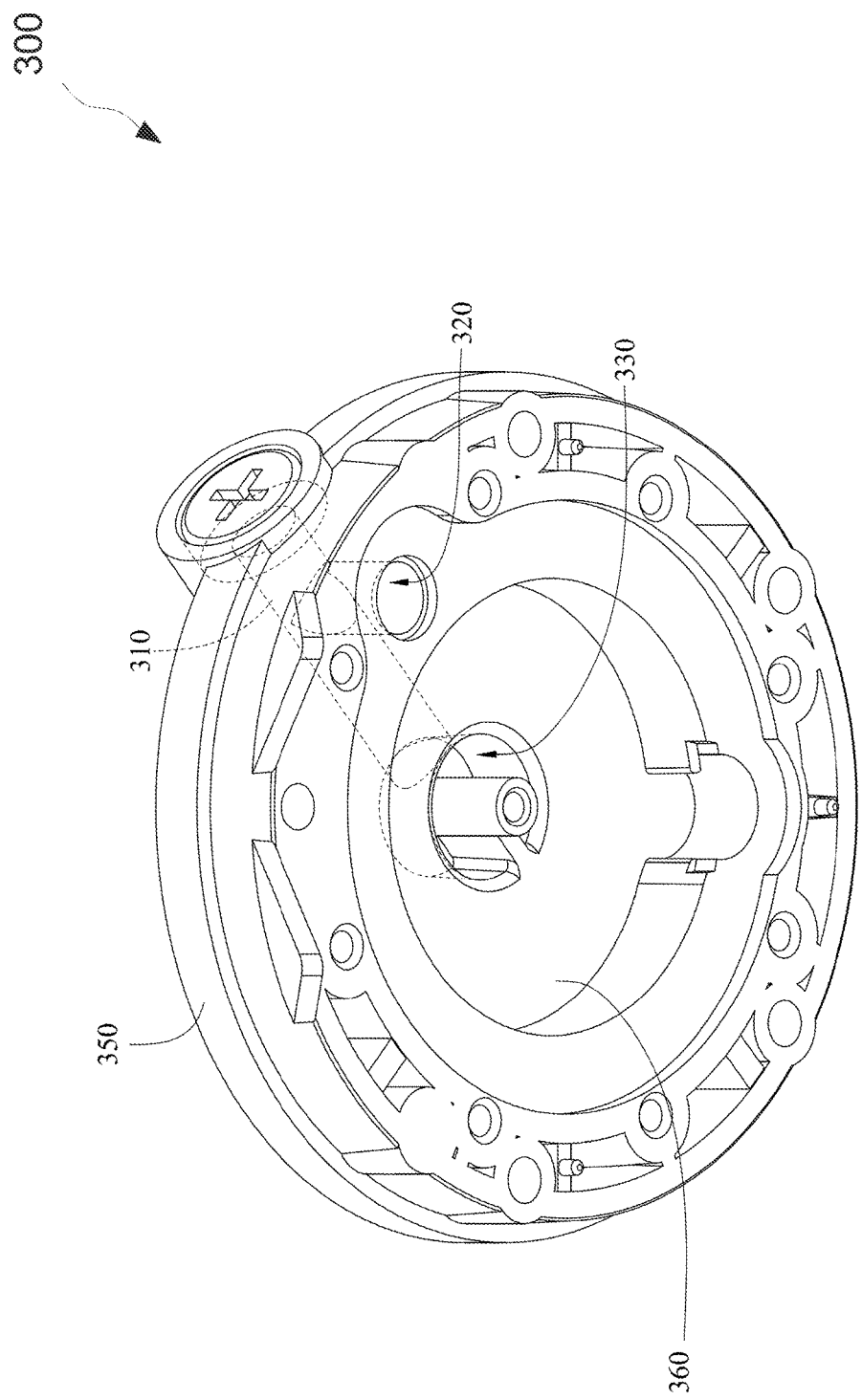
FIG. 6 is a bottom angled view of a cover of the liquid cooling pumping unit in FIG. 1.

FIG. 6 includes a cover 300 of the liquid cooling pumping unit 10. In at least one embodiment, the cover 300 further includes a conduit 310. The conduit 310 is disposed longitudinal within the cover 300 and can be cylindrical shaped. The conduit 310 is in fluid connection with the inlet 220 and in fluid connection with the first fluid chamber S1. In at least one embodiment, the cover 300 further includes a cover outlet 330. The cover outlet 330 is disposed centrally transverse within the cover 300, perpendicular to the chamber 360, and can be annulus indention shaped. The conduit 310 is in fluid connection with the first fluid chamber S1 via the cover outlet 330. In at least one embodiment, the cover 300 further includes a cover inlet 320. The cover inlet 320 is disposed transverse within the cover 300, closer to the outer side than the cover outlet 330, parallel to the chamber 360, and can be cylindrical shaped. The inlet 220 is in fluid connection with the conduit 310 via the cover inlet 320. The cover inlet 320, conduit 310, and cover outlet 330, together, define a cover passageway 320/310/330.

Figure 7:
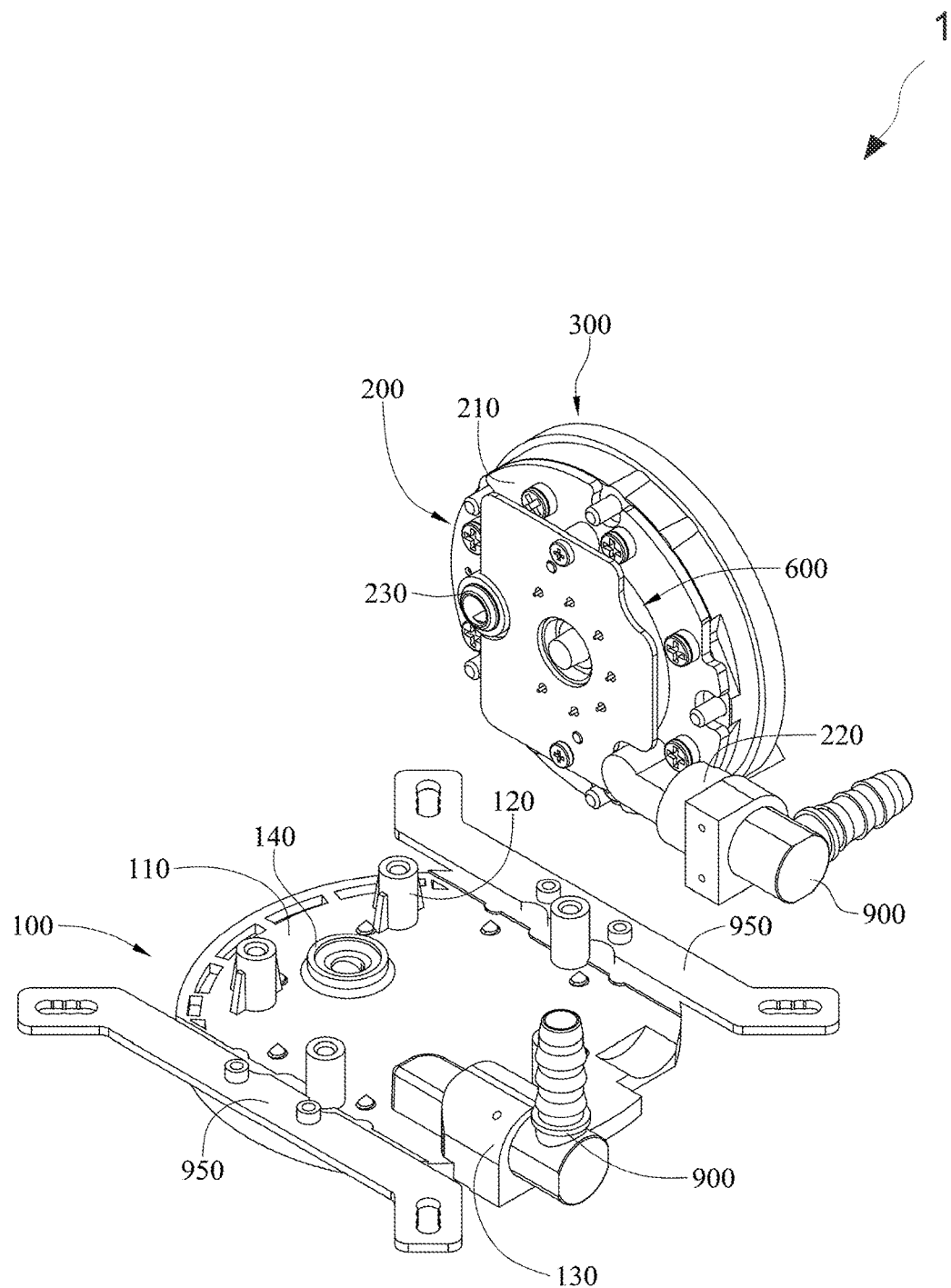
FIG. 7 is another partially exploded view of the liquid cooling pumping unit in FIG. 1.

FIG. 7 includes another partially exploded view of the liquid cooling pumping unit 10. In at least one embodiment, the base 100 further includes a plurality of fastener posts 120. The plurality of fastener posts 120 is disposed on an upper surface 111 of a body 110 of the base 100, opposite a bottom surface 112 of the body 110 of the base 100, can be a cylindrical shape, and configured to fasten the cover 300 and the housing 200 to the base 100 via, as an example, screws. In at least one embodiment, the plurality of fastener posts 120 include five plurality of fastener posts 120. In at least one embodiment, the liquid cooling pumping unit 10 further includes a pair of brackets 950. The pair of brackets 950 is assembled on opposing sides of the base 100. In at least one embodiment, the liquid cooling pumping unit 10 further includes a pair of connectors 900. One of the pair of connectors 900 is assembled on the inlet 220 and an other of the pair of connectors 900 is assembled on the outlet 130.

Figure 8:
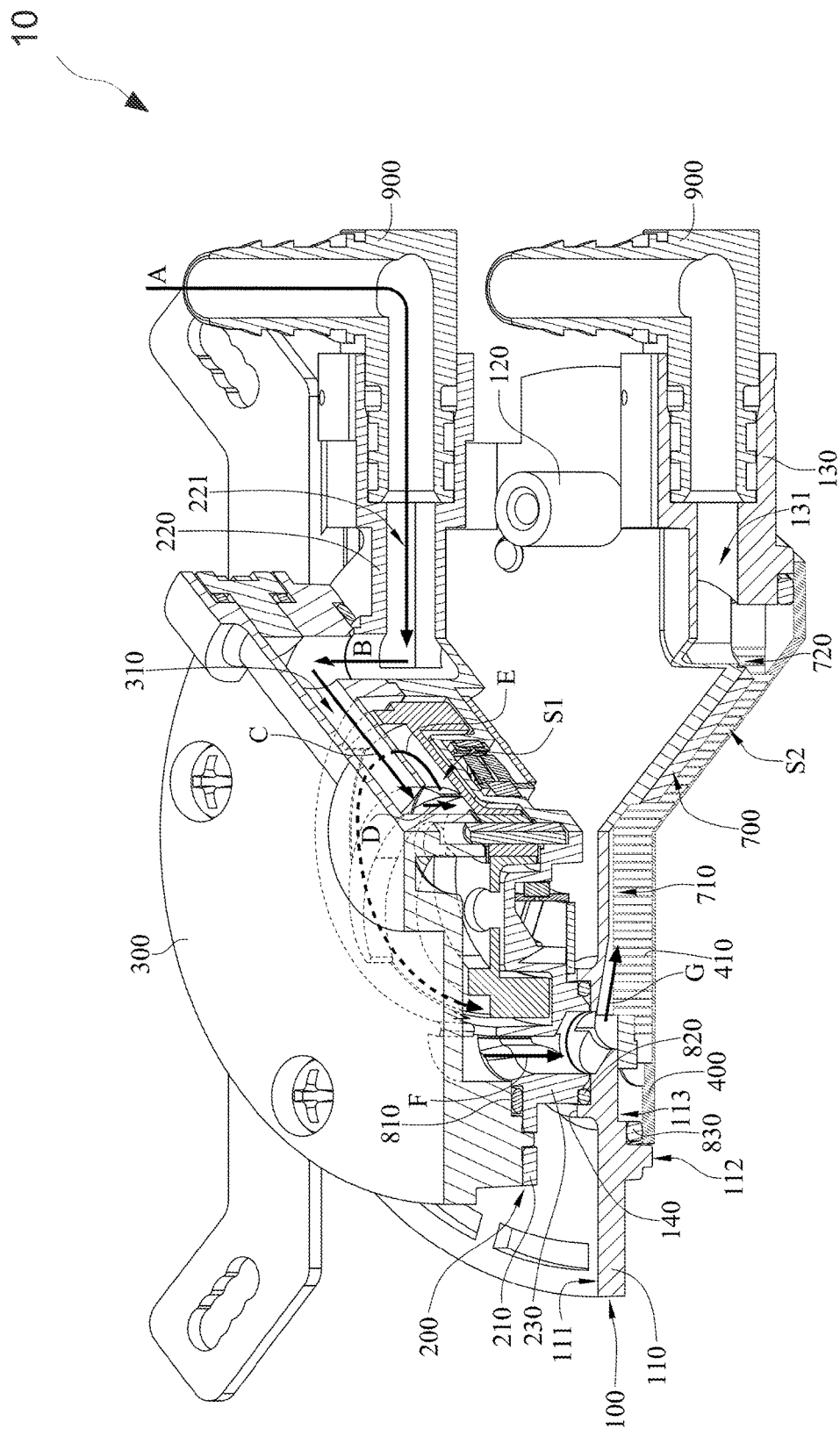
FIG. 8 is a cross-sectional view of flow implementation of the liquid cooling pumping unit in FIG. 1.
Figure 9:
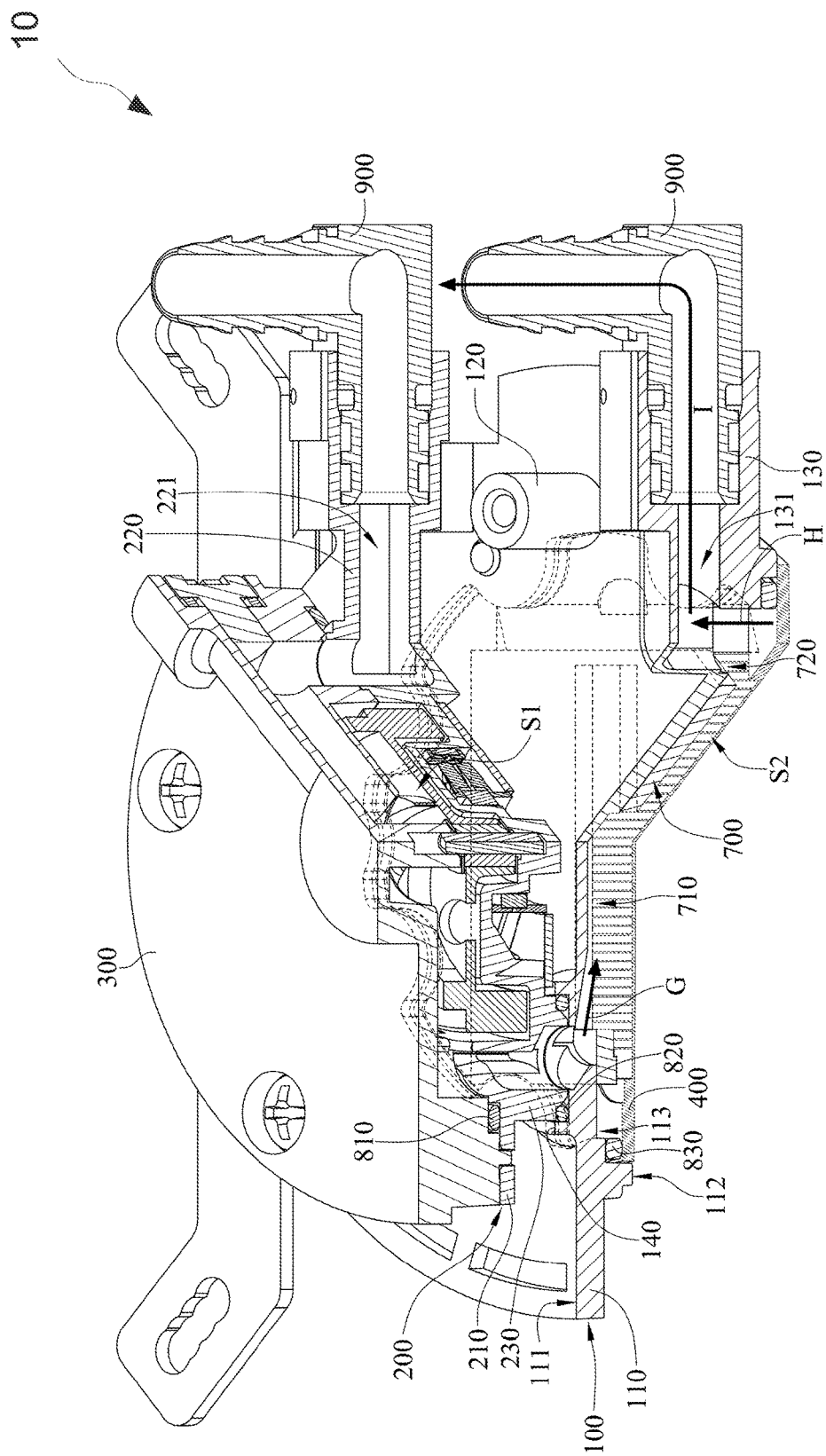
FIG. 9 is a cross-sectional view of another flow implementation of the liquid cooling pumping unit in FIG. 1.

FIGS. 8-9 are cross-sectional views of flow implementations of the liquid cooling pumping unit 10. In operation, a cooling fluid is provided within the second fluid chamber S2 defined by the flow spray plate 700 and the recess 415. When the cooling fluid is passed through the second fluid chamber S2, heat is drawn from electrical or electronic components (heat producing components) of a system that a liquid cooling system cools. The cooling fluid is passed through the second fluid chamber S2 by fluidly coupling the cover 300, the housing 200, the base 100, and the thermal plate 400 together and passing said fluid entering the first fluid chamber S1 defined by the cover 300 and the housing 200 from the input (flow A, B, C), to the second fluid chamber S2. The cover outlet 330, providing cooling fluid centrally above (flow D) the rotating impeller of the rotor 500/530 (flow E), allows for pressure within the first fluid chamber S1 to be enhanced, forcing cooling fluid through the first chamber outlet 230 and the base through hole 140 (flow F), and the through slot 710 (flow G) to the second fluid chamber S2. The through slot 710, providing cooling fluid centrally above the plurality of fins 410, allows the cooling fluid to spray throughout the second fluid chamber S2 drawing heat from electrical or electronic components (heat producing components) of a system that a liquid cooling system cools. The cooling fluid is then passed through an outlet passageway 131 (flow I) of the outlet 130 via the cut-out 720 of the flow spray plate 700 and the outlet ramp 420 of the recess 415 (flow H) where it is cooled to release the heat, effectively cooling the heat producing components. The cooling fluid is continuously pumped, as well as continuously cooled, so that continuous cooling of the heat producing components can be achieved.

The liquid cooling pumping units 10 of the present disclosure decreases the number of assembly parts, which in turn decreases the assembly steps. Assembly is simplified and the occasion of user-error and failure of said pumping units are reduced, increasing operation lifetime of cooling systems, as well as the heated environment which it cools. Furthermore, the sealing areas traditionally required for assembly is decreased, further simplifying assembly and interchangeability, and reducing the potential for leakage, which is important in an electronics environment where leakage could cause damage. Furthermore, a height of the liquid cooling pumping unit 10 is decreased, reducing excessive deflection or damage to components intended to be cooled and in the heated environment.

The liquid cooling pumping units 10 of the present disclosure watertight seals the cover 300, housing 200, base 100, and thermal plate 400 together into one liquid cooling pumping unit 10. The housing 200 having the inlet 220 and the cover 300 having the cover passageway 320/310/330 allows the liquid coolant to flow directly from the inlet 220 to the first fluid chamber S1. The housing 200 further having the chamber outlet 130 and the base 100 having the base through hole 140 allows for the liquid coolant to flow directly from the first fluid chamber S1 to the second fluid chamber S2. The base 100 further having the outlet 130 allows for the liquid coolant to flow directly from the second fluid chamber S2 to the outlet 130. Only three seal rings are required for assembly, the first seal ring 820 between the cover 300 and the housing 200, the second seal ring 820 between first chamber outlet 230 of the housing 200 and the base through hole 140 of the base 100, and the third seal ring 830 between the base 100 and the thermal plate 400. Therefore, the opportunity for parts and seals to be damaged, incorrectly selected, or improperly used or installed, resulting in leakage or improper operation are reduced, which increases lifetime of the cooling system and the components that it cools. Assembly time and chance of failure are reduced. Further yet, size and weight of the liquid cooling pumping unit 10 is decreased via the decreased parts, decreasing required footprint in particular heated environments, decreasing deflection or damage to heat producing components and components in the heated environment.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some number. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A liquid cooling pumping unit, comprising:
   a base comprising an outlet,
   a housing comprising a housing inlet, an annular chamber, and a stator chamber, the housing configured above the base,
   a cover comprising a cover chamber and an annular outer side, the cover configured above the housing, the cover chamber and the annular chamber define a first fluid chamber, whereby the housing inlet is in fluid connection with the first fluid chamber,
   a rotor comprising an impeller and a magnetic component, the impeller rotatable in the first fluid chamber, the magnetic component configured to rotate the impeller,
   a thermal plate comprising a recess, the thermal plate configured under the base,
   a flow spray plate comprising a through slot and a cut-out, the flow spray plate covering the recess, the flow spray plate and recess define a second fluid chamber, the first fluid chamber in fluid communication with the second fluid chamber via at least the through slot, the second fluid chamber is in fluid connection with the outlet via at least the cut-out, and
   a driver comprising a stator, the driver configured above the base and under the housing, the stator positioned in the stator chamber, the stator corresponding to the magnetic component of the rotor so as to drive the rotor to rotate with respect to the housing.

2. The liquid cooling pumping unit of claim 1, wherein the cover further comprises a conduit, the conduit disposed axially within the cover, the conduit in fluid connection with the housing inlet and in fluid connection with the first fluid chamber.

3. The liquid cooling pumping unit of claim 2, wherein the cover further comprises a cover outlet, the cover outlet being centrally transverse within the cover, the conduit in fluid connection with the first fluid chamber via the cover outlet.

4. The liquid cooling pumping unit of claim 3, wherein the cover further comprises a cover inlet, the cover inlet being transverse within the cover and closer to the outer side than the cover outlet, the housing inlet in fluid connection with the conduit via the cover inlet.

5. The liquid cooling pumping unit of claim 4, wherein the housing further comprises an inlet connector portion, the inlet connector portion being transverse within the housing, the housing inlet in fluid connection with the cover inlet via the inlet connector portion.

6. The liquid cooling pumping unit of claim 1, wherein the housing further comprises an annular housing ring, the annular housing ring surrounding the stator chamber and annular chamber, the housing inlet disposed on the annular housing ring.

7. The liquid cooling pumping unit of claim 6, wherein the housing further comprises a first chamber outlet, the first chamber outlet being transverse within the housing, the first fluid chamber in fluid connection with the second fluid chamber via at least the first chamber outlet.

8. The liquid cooling pumping unit of claim 7, wherein a center of the first chamber outlet and a center of the housing define a major axis, and the housing inlet is disposed on an opposite side of the first chamber outlet and offset of the major axis.

9. The liquid cooling pumping unit of claim 7, wherein the base further comprises a base through hole, and the first chamber is in fluid communication with the second fluid chamber via the first chamber outlet, the base through hole and the through slot.

10. The liquid cooling pumping unit of claim 1, wherein the base further comprises a plurality of fastener posts, the plurality of fastener posts disposed on the base and configured to fasten the cover and the housing to the base.

11. The liquid cooling pumping unit of claim 1, wherein the impeller comprises an extended impeller body and a plurality of curved blades, the extended impeller body corresponds in dimensions to the annular chamber and surpasses in depth to the annular chamber, the plurality of curved blades corresponds in dimensions to the cover chamber, and at least a portion of the extended impeller body and the plurality of curved blades correspond in depth to the cover chamber.

12. The liquid cooling pumping unit of claim 1, wherein the thermal plate further comprises a fin structure comprising a plurality of fins, the fin structure disposed within the recess of the thermal plate and every two of the plurality of fins that are adjacent to each other are spaced by a passageway therebetween.

13. The liquid cooling pumping unit of claim 1, wherein the outlet is assembled on a same plane as the housing inlet.

14. The liquid cooling pumping unit of claim 1, further comprising a first seal ring, the first seal ring assembled between and clamped by the cover and the housing.

15. The liquid cooling pumping unit of claim 1, further comprising a second seal ring, wherein the housing further comprises a first chamber outlet, wherein the base further comprises a base through hole, the second seal ring assembled between and clamped by the first chamber outlet of the housing and the base through hole.

16. The liquid cooling pumping unit of claim 1, further comprising a third seal ring, the third seal ring assembled between and clamped by the base and the thermal plate.

17. The liquid cooling pumping unit of claim 1, further comprising a pair of brackets, the pair of brackets are assembled on opposing sides of the base.

18. The liquid cooling pumping unit of claim 1, further comprising a pair of connectors, one of the pair of connectors assembled on the housing inlet and an other of the pair of connectors assembled on the outlet.

* * * * *